United States Patent [19]

Strauss et al.

[11] 4,044,457
[45] Aug. 30, 1977

[54] METHOD OF FABRICATING COMPOSITE SUPERCONDUCTING WIRE

[75] Inventors: Bruce P. Strauss, Downers Grove, Ill.; Paul J. Reardon, Princeton, N.J.; Robert H. Remsbottom, Middleton, Wis.

[73] Assignee: The United States of America as represented by the United States Energy Research and Development Administration, Washington, D.C.

[21] Appl. No.: 672,575

[22] Filed: Apr. 1, 1976

[51] Int. Cl.² .............................................. H01V 11/00
[52] U.S. Cl. ................................ 29/599; 29/DIG. 11
[58] Field of Search ................................ 29/599, 420.5

[56] References Cited

U.S. PATENT DOCUMENTS

| 3,540,114 | 11/1970 | Roberts et al. | 29/599 X |
| 3,618,205 | 11/1971 | Barber et al. | 29/599 |
| 3,710,000 | 1/1973 | Shattes et al. | 174/15 C |
| 3,925,882 | 12/1975 | Sambrook | 29/599 |

Primary Examiner—C.W. Lanham
Assistant Examiner—V. Rising
Attorney, Agent, or Firm—Dean F. Carlson; Frank H. Jackson; James W. Weinberger

[57] ABSTRACT

An improvement in the method for preparing composite rods of superconducting alloy and normal metal from which multifilament composite superconducting wire is fabricated by bending longitudinally a strip of normal metal around a rod of superconductor alloy and welding the edges to form the composite rod. After the rods have preferably been provided with a hexagonal cross-sectional shape, a plurality of the rods are stacked into a normal metal extrusion can, sealed and worked to reduce the cross-sectional size and form multifilament wire. Diffusion barriers and high-electrical resistance barriers can easily be introduced into the wire by plating or otherwise coating the faces of the normal metal strip with appropriate materials.

8 Claims, 5 Drawing Figures

METHOD OF FABRICATING COMPOSITE SUPERCONDUCTING WIRE

CONTRACTUAL ORIGIN OF THE INVENTION

The invention described herein was made in the course of, or under, a contract with the UNITED STATES ENERGY RESEARCH AND DEVELOPMENT ADMINISTRATION.

BACKGROUND OF THE INVENTION

This invention relates to a method of manufacturing electrical conductors having superconducting properties. More specifically, the invention relates to an improved method for manufacturing multifilament composite superconducting wire.

One present method for preparing multifilament composite superconducting wire requires that a cylindrical rod of ductile superconducting material be inserted into a tube of normal or nonsuperconducting metal to form a composite rod about 2 feet long. About 2000 of the composite rods, which are hexagonal in cross section to improve packing density, are tightly packed into an extrusion can of normal metal, which is then sealed to form an assembly, and reduced in cross section by various methods of cold and hot working which are well known in the art to produce a multifilament composite wire containing elements of the superconductor material in a matrix of ductile nonsuperconductor material.

The preparation of composite rods is difficult and time-consuming because of the close tolerances necessary to ensure a good bond between the metals after they have been worked. Each rod of superconducting material must be carefully straightened so that it can be inserted into the hexagonally shaped tube of normal metal. The close tolerances are also necessary to prevent the presence of any contamination. It is important that the hexagonal shape of the outer surface of the tubes be dimensionally accurate so that large numbers of composite rods can be tightly packed into the extrusion can, to prevent trapping of gas or other contaminants between the rods which would have a deleterious effect upon the superconductor. Thus preparation of composite superconducting wire by the aforedescribed method is time-consuming, expensive and due to the requirement for close tolerances, necessitates the acquisition of expensive components.

Some of the various uses for multifilament wire require that the wire have certain electrical characteristics which must be provided at the time of manufacture. For example, when the wire is to be used in certain magnets, it is preferred that the individual superconducting filaments in a multifilament wire be isolated from each other not only by the matrix of normal metal, but also by a layer of high resistance normally conducting material in order to reduce coupling and eddy currents. This is especially important for ac magnets that are to be used in some particle accelerators. At present this high resistance barrier is provided by applying a coating or layer of high resistance material such as cupronickel (Cu[10–30%]Ni) to the exterior of the hex-shaped tubes before they are packed into the extrusion can.

Conditions required for the production of certain types of superconducting wires such as high-temperature extrusion may cause the migration or diffusion of atoms of normal metal into the superconducting alloy and viceversa with a resulting destruction of the superconducting properties. This problem has been solved in the past by providing a diffusion barrier such as pure niobium on the surface of the rod of superconducting alloy before it is inserted into the tube of normal metal.

SUMMARY OF THE INVENTION

We have developed a method for fabricating multifilament composite superconducting wire which is simpler and less expensive than the prior art method for preparing similar wire. Our method eliminates the necessity of procuring expensive materials having close tolerances and provides a method by which diffusion barriers and high-electrical-resistance areas can be easily and relatively inexpensively provided. By the method of our invention for fabricating multifilament composite electrical conductors, a strip of ductile normal metal is bent longitudinally around a rod of ductile superconductor alloy so that the longitudinal edges of the strip meet to form a mechanical bond between the metals, the width of the strip being about equal to the circumference of the rod, and joining the edges to form an annular sheath around the rod. Preferably the rod is then provided with a hexagonal cross-sectional shape, a plurality of the hexagonal-shaped composite rods are stacked in parallel in an extrusion can of ductile normal material to form an assembly, and the assembly is worked to reduce the cross section to a predetermined size, thus producing a composite wire containing filaments of superconducting material in a matrix of normal metal.

The method of the invention is advantageous over the prior art in that it is relatively simple to mechanically bend the strips of normal metal longitudinally around the rod of superconducting material so that there is a good mechanical bond between the two metals, thus eliminating the tedious straightening of the rods before insertion into the normal metal tube and vastly speeding up the preparation of the composite rods. It now becomes a simple matter to apply diffusion barriers or high-resistance coatings to the composite rods, for they may now be applied to the appropriate surface of the normal metal strip before it is formed about the rod.

In one embodiment, the strip of normal metal is first provided with a thin layer of diffusion barrier material on the inner surface which will contact the superconducting alloy rod. If required, the strip may also be provided with a layer of high-electrical-resistance material such as, for example, nickel on the opposite or outer surface before the strip is formed around the rod.

It is therefore one object of the invention to provide an improved method for preparing multifilament composite superconducting wire.

It is another object of the invention to provide an improved method for preparing a composite rod of superconducting material containing an annular sheath of normal metal that is simpler and less expensive than prior art methods.

Finally, it is the object of the invention to provide a method for preparing multifilament composite superconducting wire in which vapor barriers and high-electrical-resistance layers can be easily and inexpensively provided in the conductor.

DESCRIPTION OF THE PREFERRED EMBODIMENT

Figure 1:
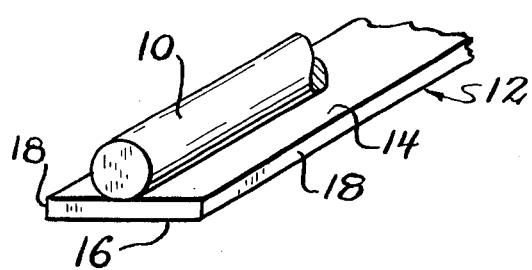
FIGS. 1–4 are perspective views showing the sequence of steps for the preparation of the composite rod of superconducting and normally conducting material.

These and other objects of the invention may be met by bending longitudinally a strip of ductile copper around a rod of ductile superconducting alloy such as NbTi or NbZr so that the longitudinal edges meet to form a mechanical bond between the two metals, the width of the strip being about equal to the circumference of the rod, joining the longitudinal edges together, thereby forming a composite rod having a circular cross section, passing the composite rod through a hexagonal-shaped die to provide the rod with a hexagonal cross-sectional shape, and stacking a plurality of composite rods in parallel in an extrusion can of copper to form an assembly and working the assembly to elongate and reduce the cross section of the assembly to a predetermined cross-sectional size, thereby producing a composite wire containing filaments of superconducting material in a matrix of normal metal.

In one embodiment of the invention, a thin diffusion barrier layer is applied to the inner face of the normal metal strip which will contact the rod of superconducting alloy to prevent diffusion between the normal metal and the alloy during high-temperature working of the completed assembly. The composition of the barrier will depend upon the composition of the normal metal and the alloy, but generally a layer about 0.1 to 0.5 mils of niobium or tantalum will prevent diffusion of copper into a NbTi or NbZr alloy at the temperatures required for working the composite billet. The diffusion barrier may be applied to the face of the normal metal strip by any method known in the art such as vapor plating.

In another embodiment, a thin layer of high-electrical-resistance material such as german silver or a copper-nickel alloy such as Cu, 10–30% Ni is applied to the outer face of the normal metal strip which will form the outer surface of the completed composite rod. Alternatively, a layer of material such as nickel or tin may be applied to the face of the ribbon. These metals will diffuse into the surface of the copper normal metal during high-temperature processing of the assembly to provide an alloy having a high electrical resistance on the surface of the normal metal within the composite wire. Such materials can be applied to the strip by vapor plating, electrolytic or electroless plating in a layer of from about 0.1 to 0.5 mils in thickness as required to provide the necessary amount of resistivity. Alternatively, the layer of high-resistance material may be applied to the exterior of the completed composite rod either before or after the rod has been provided with the hexagonal cross-sectional shape.

Preferably the method of this invention is useful for the production of composite superconductors from any type II solid solution ductile superconducting alloy such as niobium-titanium and niobium-zirconium. The precise composition of the alloy will depend upon the characteristics desired. For example, an alloy may range in composition given in weight percent from about 60% niobium, 40% titanium to 40% niobium, 60% titanium or from 80% niobium, 20% zirconium to 20% niobium, 80% zirconium. The diameter of the rod will vary depending upon the desired thickness of the filament in the final conductor. Thus, for example, it may typically vary from about 1/16 to about ¼ inch or more in diameter. The preferred ductile normal metal is a highly purified ductile copper such as CDA-101 or ASTM B-170-1, although strips of other low-resistance normally conductive metals such as aluminum or silver can be substituted. The width of the strips will depend upon the circumference of the rod of superconducting alloy and should be such that the opposed edges of the ribbon meet when formed around the central rod of superconducting alloy. The thickness of the normal metal ribbon will depend upon the amount of matrix metal desired between strands of superconductor and upon the amount of reduction which is to take place and in general may vary from 20 to 40 mils.

Figure 2:
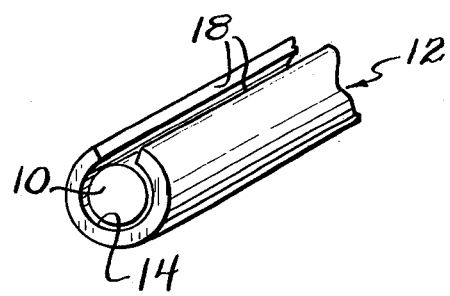
Figure 3:
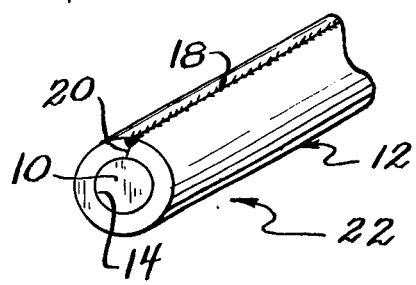
Figure 4:
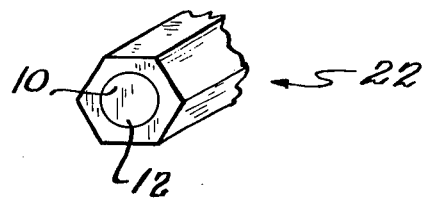

Referring now to the drawings, FIGS. 1 to 4 show the sequence of steps of forming the composite rod. In FIG. 1, rod 10 of ductile superconducting alloy is positioned on normal metal strip 12 having upper or inner face 14 and lower or outer face 16 and longitudinal edges 18. The width of strip 12 is about equal to the circumference of rod 10. Faces 14 and 16 may be provided with layers of various materials as hereinbefore described. FIG. 2 shows strip 12 bent longitudinally almost completely around rod 10, while in FIG. 3 face 14 is in close contact with the surface of rod 10, and longitudinal edges 18 are butted to form joint 20 which must then be joined to complete composite rod 22. FIG. 4 shows a completed rod which has been provided with a hexagonal cross-sectional shape.

The normal metal strip 12 may be bent or rolled longitudinally around rod 10 by any convenient method known to those in the art for forming round tube or pipe from metal strips such as roll forming, center forming or true radius forming. It is important that there be good mechanical contact between the two metals. Preferably, the two longitudinal edges of the normal metal strip forming the butt joint should be joined together to prevent their separation during subsequent operations on either the composite rod or on the assembly. Thus, the edges may be joined by any convenient welding means, using heat such as gas, arc or resistance welding or by cold-joining methods such as vacuum-welding or diffusion-bonding without vacuum.

After formation of the composite rod, it has a circular cross section. It is, however, preferred that the composite rods be hexagonal in cross section in order to increase the packing density of the rods in the extrusion can. This hexagonal-shaped cross section can be provided by any means known to those skilled in the art such as by passing the rod through a series of appropriately configured rollers or by passing the rod through a die having a hexagonal-shaped opening of the appropriate size. The preparation of the composite rod may be a continuous operation in which a strip of normal metal if formed around a continuous rod of superconducting alloy to form a composite rod which is then welded and provided with the desired shape and cut into appropriate lengths or the operation may be of the batch type in which individual lengths of strips and rods are joined and shaped.

Figure 5:
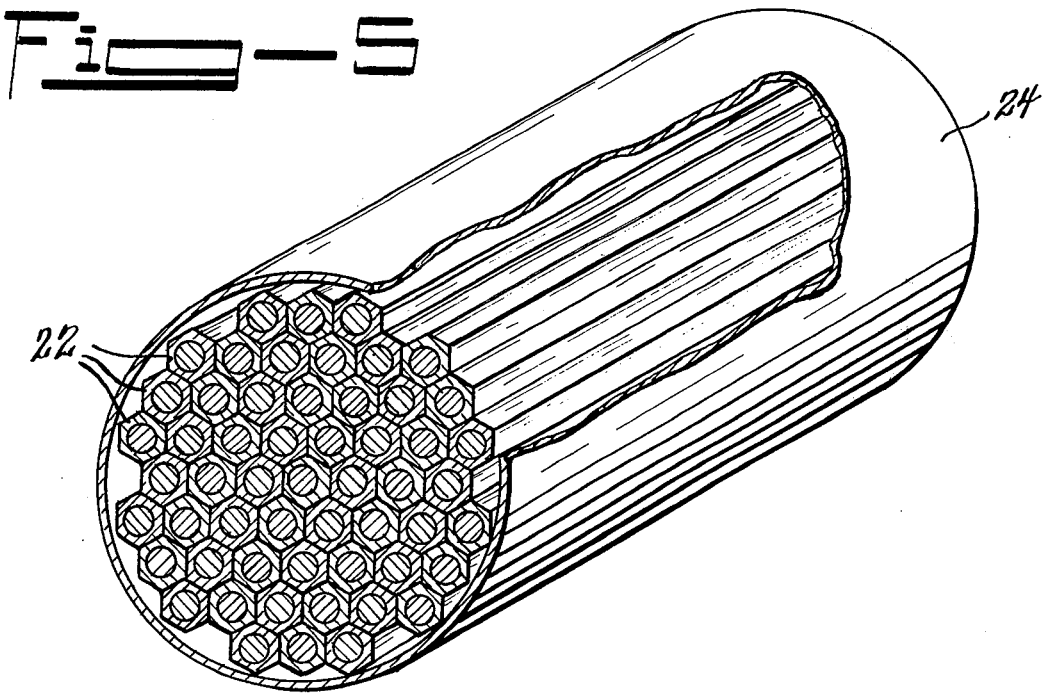
FIG. 5 is a cut-away perspective view of an assembly of composite rods in an extrusion can ready for working.

After preparation of the composite rods is completed, a large number of rods 22 are tightly stacked in parallel array in extrusion can 24 as indicated in FIG. 5. The extrusion can, which is typically copper, is then sealed and evacuated to form an assembly. The assembly is then worked by any suitable means such as extruding or swaging or rolling or drawing or any combination necessary and at whatever temperatures are necessary to achieve sufficient size reduction to form a composite wire of superconducting filaments in a normal metal matrix.

The following example is given as illustrative of the method of the invention and is not to be taken as limiting the scope of the invention which is defined by the appended claims.

EXAMPLE

A ribbon of copper 20 to 30 mils thick and 0.392 inch wide is formed longitudinally around a ⅛ inch diameter rod of niobium — 46 ½ weight percent titanium to form a composite rod having a circular cross section and the seam is resistance welded. The rod is then passed through a die having a hexagonal-shaped opening to form a composite rod having a hexagonal-shaped cross section about 165 mils in diameter. The composite rods are straightened and cut into lengths 23 11/16 inches long. About 2,200 of these rods are tightly packed in a parallel array into a copper extrusion can 24 inches long, having a 10 inch overall diameter with ½ thick walls. The can is then sealed with a copper cover to form an assembly and then evacuated. The assembly is then heated to 1100° to 1200° F. and extruded to give a 16 to 1 reduction in overall diameter. The assembly is then drawn in several stages to give a composite electrical conductor having about a 25 mil diameter and containing fine filaments of superconductor in a normal metal matrix. During the final drawing stages the wire may be heat-treated several times as necessary to maintain ductility and to improve the critical current and critical temperature characteristics of the superconductor.

As can be seen from the above discussion and example, the method of the invention provides an economical and effective method for the preparation of composite rods of superconducting material in normal metal but also provides an economical and effective method for providing diffusion barriers and different electrical characteristics to the composite wire.

The embodiments of the invention in which an exclusive property or privilege is claimed are defined as follows:

1. In the method for preparing multifilament composite electrical conductors in which a rod of ductile superconducting alloy is provided with an annular sheath of ductile normal metal to form a composite rod, a plurality of composite rods having a hexagonal cross-sectional shape are stacked in parallel into an extrusion can of ductile normal metal to form an assembly, and the assembly is worked to elongate and reduce the cross section of the assembly to a predetermined cross-sectional size, thereby forming a multifilament composite electrical wire, the improvement in the method for preparing the composite rod comprising: bending longitudinally a strip of ductile normal metal around a rod of ductile superconductor alloy so that the longitudinal edges meet, the strip having an inner face which will contact the rod and an outer face, the inner face containing a diffusion barrier, the width of the strip being about equal to the circumference of the rod, joining the longitudinal edges together, thereby forming an annular sheath around the rod, and providing the rod with a hexagonal cross-sectional shape, thereby forming a composite rod of a superconducting alloy material in a normal metal sheath having a hexagonal cross-sectional shape.

2. The method of claim 1 wherein the rod of ductile superconducting alloy is selected from the group consisting of niobium — 40 to 60 weight percent titanium and niobium — 20 to 80 weight percent zirconium.

3. The method of claim 2 wherein the strip of normal metal is selected from the group consisting of copper, aluminum and silver and the longitudinal edges are joined by welding.

4. The method of claim 3 wherein the strip of normal metal is copper, the strip is 20 to 40 mils in thickness, the rod of superconducting material is about 1/16 to ¼ inch in diameter and the composite rod is provided with a hexagonal cross-sectional shape by passing the rod through a die.

5. The method of claim 3 wherein the strip of normal metal is copper, the diffusion barrier is selected from the group consisting of niobium and tantalum, and the barrier is 0.1 to 0.5 mil in thickness.

6. The method of claim 3 wherein the strip of normal metal is copper, the outer face of the strip has a laayer of material selected from the group consisting of german silver, copper-nickel alloy, nickel and tin, and the layer is 0.1 to 0.5 mil in thickness.

7. The method of claim 3 wherein the strip of normal metal is copper, the diffusion barrier is selected from the group consisting of niobium and tantalum and the outer face has a layer of material selected from the group consisting of german silver, copper-nickel alloy, nickel and tin, the layers being 0.1 to 0.5 mil in thickness.

8. The method of claim 7 wherein the normal metal strip is 20 to 40 mils in thickness, the diffusion barrier is niobium, the outer face has a layer selected from the group consisting of tin and nickel, and the ductile superconducting alloy is niobium — 40 to 60 weight percent titanium.

* * * * *